United States Patent [19]
Doyle et al.

[11] Patent Number: 5,374,859
[45] Date of Patent: Dec. 20, 1994

[54] LOW POWER DUAL POWER SUPPLY HIGH RESOLUTION COMPARATOR

[75] Inventors: James T. Doyle, Chandler, Ariz.; Yong-Bin Kim, Hillsboro, Oreg.

[73] Assignee: Intel Corporation, Santa Clara, Calif.

[21] Appl. No.: 56,308

[22] Filed: Apr. 30, 1993

[51] Int. Cl.$^5$ ............................................. H03K 5/24
[52] U.S. Cl. ..................... 327/65; 330/253; 330/261; 327/63
[58] Field of Search ............... 307/355, 356, 494, 495; 328/146; 330/253, 261

[56] References Cited

U.S. PATENT DOCUMENTS

| | | | |
|---|---|---|---|
| 4,965,468 | 10/1990 | Nichollini et al. | 307/494 |
| 5,047,666 | 9/1991 | Astegher et al. | 307/494 |
| 5,068,550 | 11/1991 | Barre | 307/356 |
| 5,115,154 | 5/1992 | Terado | 307/494 |
| 5,285,168 | 2/1994 | Tomatsu et al. | 330/253 |

Primary Examiner—Steven L. Stephan
Assistant Examiner—Shawn Riley
Attorney, Agent, or Firm—Blakely, Sokoloff, Taylor & Zafman

[57] ABSTRACT

A low power comparator is provided in which a wide common mode range, high resolution and near continuous operation is achieved. The comparator of the present invention employs a wide common mode range with true one millivolt resolution. Furthermore, the comparator is a low power device rendering it readily adaptable to today's portable low power devices. An innovative three stage comparator is described. The first stage receives the two input signals to be compared. A number of innovations are utilized to minimize the offsets and therefore errors in the comparison measurements. More particularly, a transmission gate is provided at the inputs to balance the differential amplifiers employed in the first stage. The balance of the differential output nodes permits fast settling time of the comparator and minimizes voltage stresses which can create offsets. Furthermore, the design incorporates fully symmetric loads and is interdigital for optimum matching and minimum size. The second stage circuit utilizes a unique cascode circuit which provides very high gain thereby enabling the comparator to function at a higher resolution. Furthermore, a gain loop is created in the second stage such that the output swing is within 0.2 of a volt of the voltage rail, thereby realizing the benefit of stack cascoded devices with the advantage of optimal swing at low voltage operation. The third stage modifies the two signal differential output of the second stage to a single signal output of the circuit.

13 Claims, 8 Drawing Sheets

Figure 4a
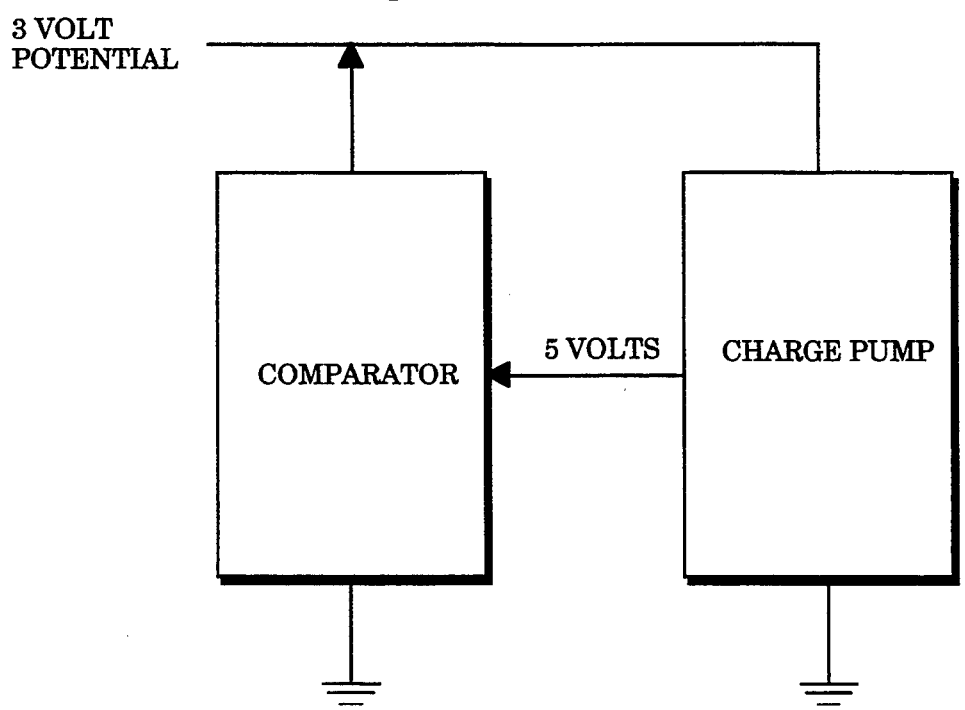
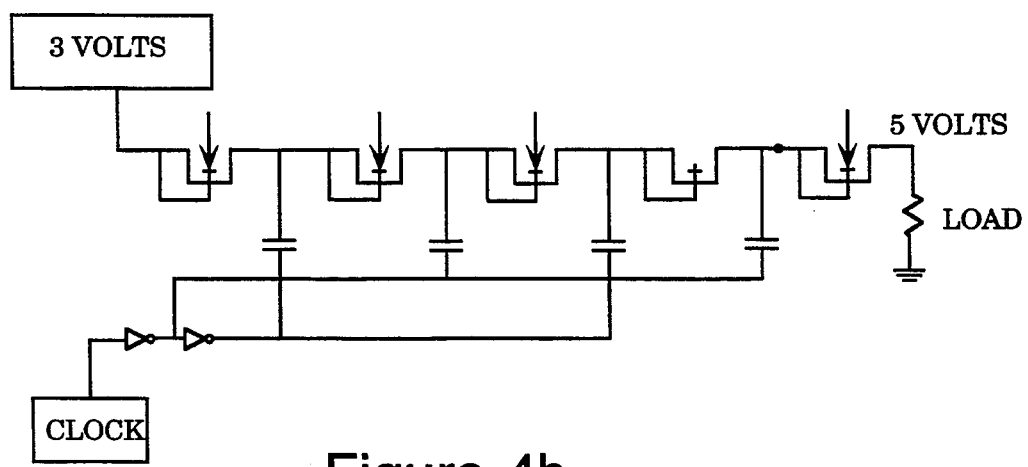
Figure 4b

LOW POWER DUAL POWER SUPPLY HIGH RESOLUTION COMPARATOR

BACKGROUND OF THE INVENTION

1. Field of the Invention

The present invention relates to an improved continuous duty comparator circuit. More particularly, the present invention relates to a low power comparator having a wide common mode range and high resolution, utilizing common digital CMOS processing technology.

2. Art Background

A comparator is a circuit that tells which of two inputs is larger. Comparators are used for a variety of applications. The simplest form of a comparator is the high gain differential amplifier constructed with transistors or operational amplifiers. A number of semiconductor chips exist on the market which perform the function of comparators. CMOS comparators are typically used in low voltage applications. However, due to fabrication sensitivities and manufacturing consumption constraints the resolution of typical comparators is limited to approximately 10 millivolts (mv). For example, in order to achieve true 1mv resolution using a 3 volt power supply, a minimum of 3,000 steps is required along with a gain of 68 dB.

The main problem in developing a high gain comparator is that even though, ideally, it is possible to develop a very high gain comparator from simple digital stages such as inverters, the usable gain is only a small fraction of the ideal since offsets, which are realized at the output as measurement errors, of the individual stages are multiplied by the following stages. This implies that a precision analog circuit design implementation such as utilized by operational amplifiers is preferred. If analog circuit design techniques and layout methods are utilized, it is possible to design a circuit in which the individual stage offsets are small, and the offset contributions do not reduce the reflective offset at the input. Large gain is required since it is desirable to have the output switch to the supply rails so that the comparator can directly interface with a digital latch. In order for the comparator to convert 1 millivolt into 5 volts the gain must be greater than 5,000.

Some comparators can be characterized as a continuous duty comparator in which the two input signals are continuously compared to generate a differential output signal. However, the circuit is degraded by offsets incurred while performing the comparison. This is primarily due to manufacturing misalignments and gradients.

Another type of comparator is an offset corrected or clocked comparator in which the two inputs are periodically sampled and compared. To compensate for offsets, error compensation techniques are employed. For example, a capacitor is located at the output of the comparator to store the output. The charge stored in the capacitor is flipped in orientation and is subsequently discharged back into the comparator to cancel the offset. However, the charge injection from the capacitor and noise due to spikes is a constant problem. Also, noise injected by switching can present a significant problem. Furthermore, amplification of the output of the comparator amplifies the offset and increases the frequency of errors. Today's technology requires higher resolution, broad common mode range, no offsets and devices which consume little power. Thus, it is desirable to use a continuous duty comparator with little or no offsets and a wide common mode range.

In a system, such as an analog to digital converter (ADC), the comparator element typically causes the most significant contribution to the ADC error budget. The comparator typically determines the resolution as well as the switching speed and settling characteristic of an ADC. When evaluating error budgets, the digital to analog converter (DAC) contributes the second most significant contribution. From this system understanding it is clear that improvements in the comparator will significantly improve the ADC performance. The ADC in turn is used to provide a real world interface in order to perform comparisons to render decisions such as battery level voltage, ambient light power down conditions, etc. Thus, the overall performance and battery life of a system is to a large extent dependent on the efficiency and accuracy of the comparator.

SUMMARY OF THE INVENTION

A low power comparator is provided in which a wide common mode range, high resolution and near continuous operation is achieved. The comparator of the present invention employs a wide common mode range with true one millivolt resolution. Furthermore, the comparator is a low power device rendering it readily adaptable to today's portable low power devices.

An innovative three stage comparator is described. The first stage receives the two input signals to be compared. A number of innovations are utilized to minimize the offsets and therefore errors in the comparison measurements. More particularly, a transmission gate is provided at the inputs to balance the differential amplifiers employed in the first stage. The balance of the differential output nodes permits fast settling time of the comparator and minimizes voltage stresses which can create offsets. Furthermore, the design incorporates fully symmetric loads and is interdigital in layout for optimum matching and minimum size.

The second stage circuit utilizes a unique cascode circuit which provides very high gain thereby enabling the comparator to function at a higher resolution. Furthermore, additional gain is created in the second stage such that the output swing is within 0.2 volts of the voltage rail, thereby realizing the high gain benefit of stack cascoded devices with the advantage of optimal swing at low voltage operation. The third stage modifies the two signal differential output of the second stage to a single signal output of the circuit.

The bias circuit provides the bias voltages and currents required by the differential amplifiers in the first and second stage. This dual powered circuit includes a temperature compensation circuit using bipolar diodes, wherein the temperature coefficient of the diode and the resistor cancel each other and the biased circuitry is therefore less sensitive to temperature variation. In addition the availability of a second power supply potential is utilized to increase the reverse bias potential between P-plus resistor and N-well devices. This results in a significant reduction in the voltage coefficient further improving the performance of the circuit. Furthermore, the closed loop bias circuit is designed to avoid a latch state which can cause errors.

The startup circuit is designed to eliminates in error due to control switches by using a matched and symmetric current mirror network with paths that eliminate the power down switching devices in the current mirror. Power down circuitry is accomplished with a minimum number of devices. The startup circuit path can be shut down under micro-computer control which eliminates any residual error due to a small offset current present in one of the current source legs. Since the current source is operating in the subthreshold region, the amount of residual error is particularly important, as a relatively small error would be multiplied in the mirror circuit.

BRIEF DESCRIPTION OF THE DRAWINGS

The objects, features and advantages of the present invention will become apparent to one skilled in the art from the following detailed description in which:

FIG. 4a is a block diagram illustrating the use of a charge pump to provide voltage input in one embodiment of the comparator of the present invention.

FIG. 4b is an exemplary circuit of a charge pump.

DETAILED DESCRIPTION OF THE INVENTION

In the following description for purposes of explanation numerous details are set forth in order to provide a thorough understanding of the present invention. However, it will be apparent to one skilled in the art that these specific details are not required in order to practice the invention. In other instances well known electrical structures and circuits are shown in block diagram form in order not to obscure the present invention unnecessarily.

Figure 1:
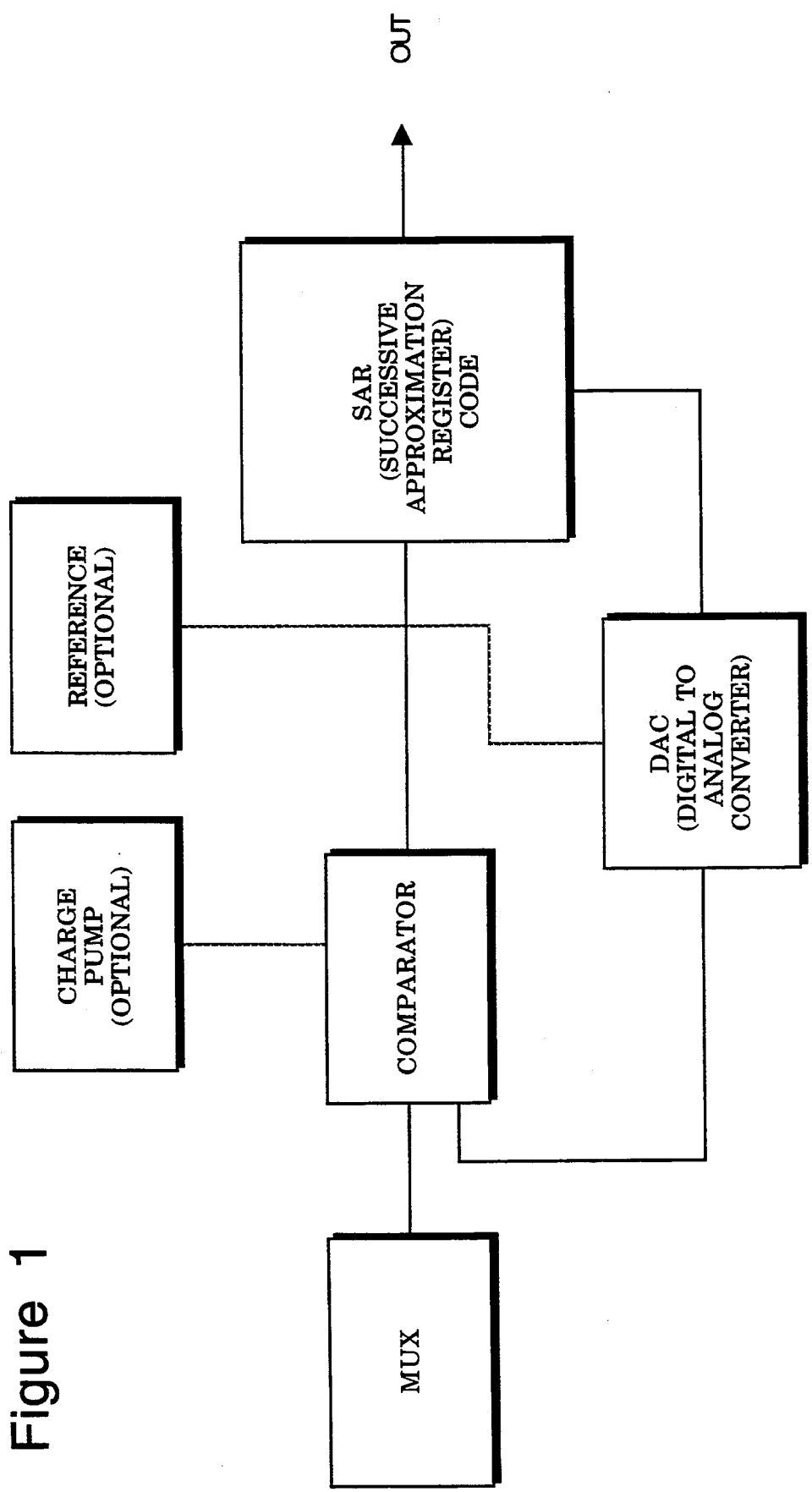
FIG. 1 is a system block diagram employing the comparator of the present invention.

A block diagram of an exemplary system employing the comparator of lo the present invention is shown in FIG. 1. The comparator provides a significant contribution to the operation of the analog to digital converter (ADC) system of FIG. 1. Therefore, errors generated by the comparator contribute significantly to the errors generated during operation of the system. Comparators are utilized in a variety of other circuits, for example, circuits which determine power levels such as battery levels and ambient light power down conditions.

Figure 2:
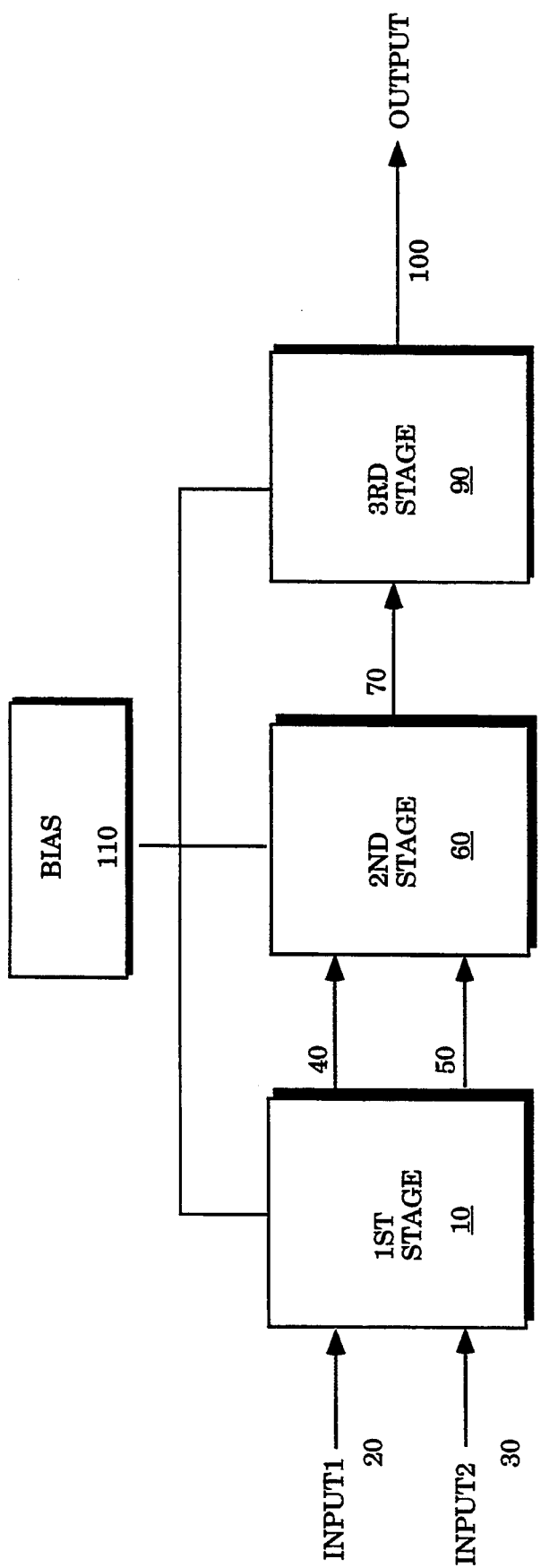
FIG. 2 is a block diagram illustration of the comparator of the present invention.

A block diagram of the comparator of the present invention is illustrated in FIG. 2. The comparator includes a first stage differential amplifier 10 which receives a first and second input 20 and 30 and outputs a first and second differential output 40, 50. The first and second differential output 40, 50 are input to a second stage differential amplifier 60 which amplifies the differential and outputs the differential values to a third stage 90 which generates a single output value 100 indicative of the comparison performed between the two input values 20, 30. The bias circuit 110 provides the necessary current and voltage biasing signals required to operate the three stage comparator circuit.

Figure 3:
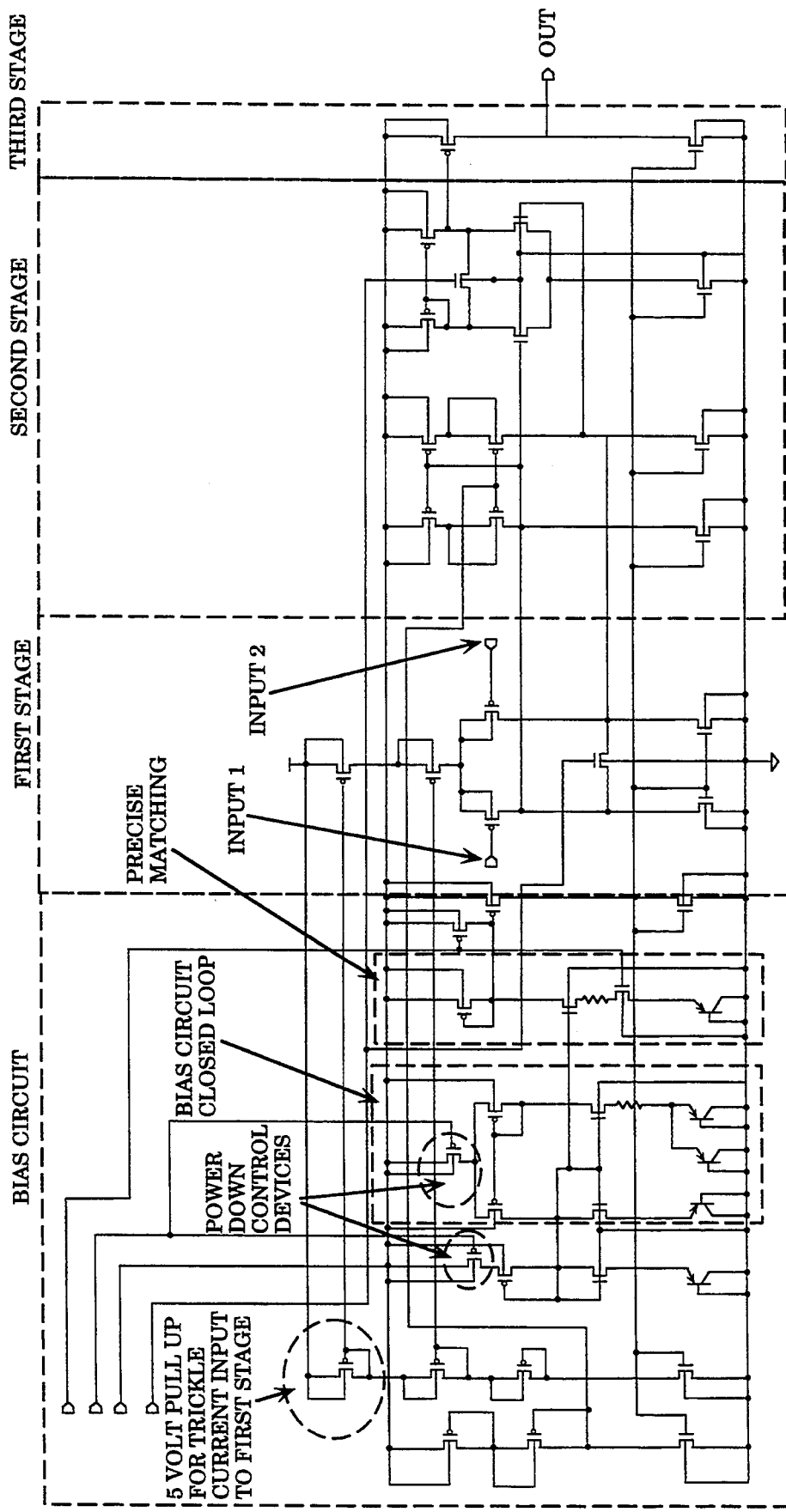
FIG. 3 is a circuit diagram of one embodiment of the comparator of the present invention.

An embodiment of the comparator of the present invention is illustrated by the circuit diagram of FIG. 3. The comparator circuit includes a number of innovations which enable the comparator to operate at low power, but provide a wide common mode input range and true 1 millivolt resolution. The comparator circuit of the present invention preferably uses a dual power supply, such as three volts and five volts, although a single power supply such as three volts can be used in conjunction with a charge pump circuit. A diagram illustrating the use of a charge pump circuit is shown in FIG. 4a. The charge pump circuit receives a three volt input from the power supply and generates a five volt signal used in the comparator circuit. FIG. 4b is an illustrative circuit diagram of a charge pump circuit which generates a five volt output from a three volt input. When designed using N-well CMOS process technology, the charge pump can supply voltage potential greater than the power source on the same piece of silicon, still maintaining the necessary isolation potentials to prevent forward biased junctions or the formation of parasitic devices.

The primary source of power in the comparator circuit of the present invention is the three volt power source; a minimum number of components are connected to the five volt power supply. Therefore, the current derived from the five volt power supply is very small. This is particularly significant for an embodiment employing a single power supply operation, since the charge pump efficiency can reduce battery life. Taking advantage of this configuration, the dual power supply permits a circuit design that operates at a low power supply voltage while maintaining a wide common mode range, high resolution and minimum offsets and lower power consumption due to having most of the circuitry operating from the lower power supply. Furthermore, in single power supply operation, the comparator operation can include circuitry to detect voltages at or above the supply voltage.

Figure 5:
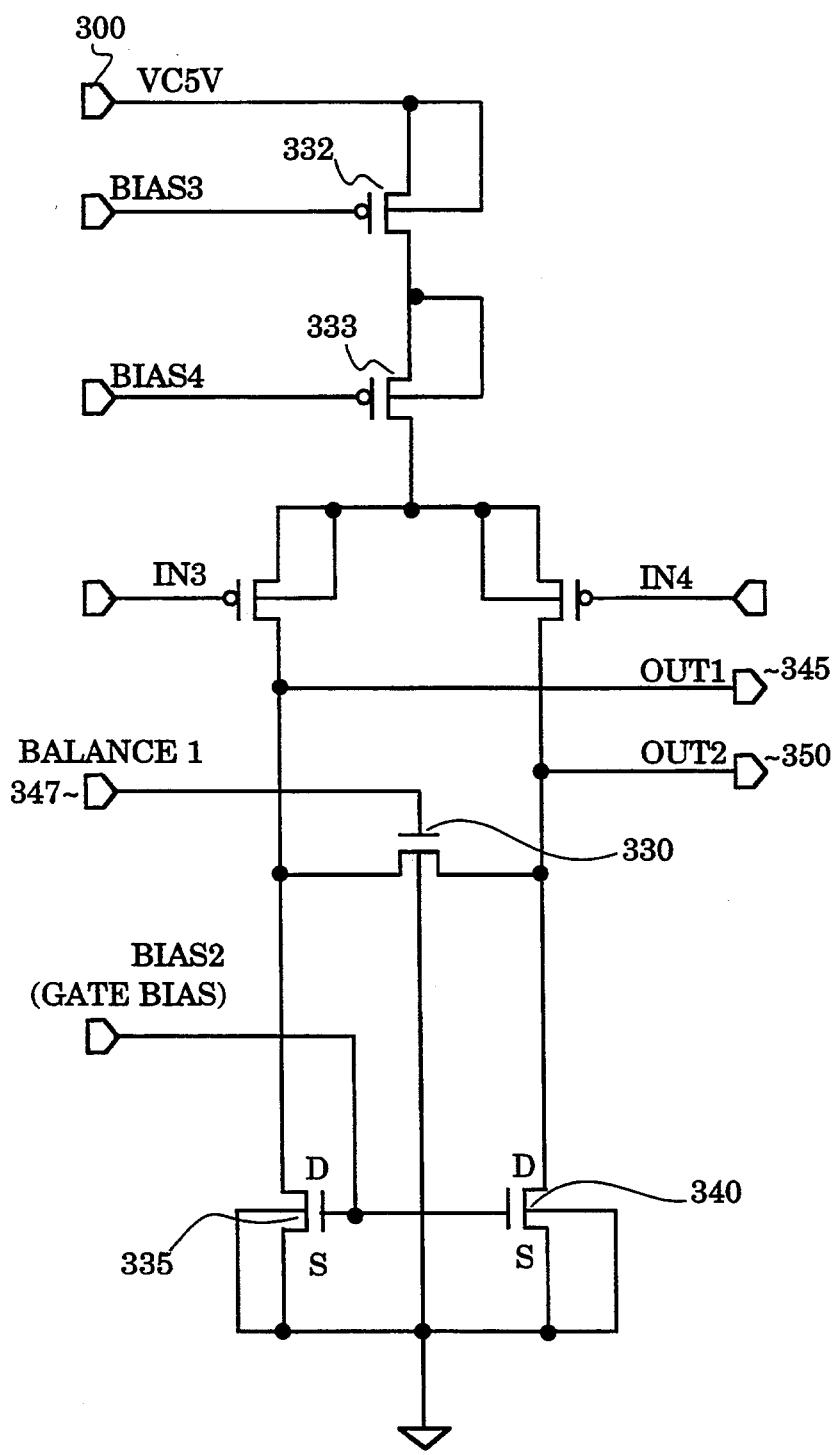
FIG. 5 is an exemplary circuit diagram of a portion of the first stage of the three stage comparator of the present invention.

In particular, referring to FIG. 5, the five volt supply 300 is used as a trickle source which has an extremely low power pull-up that permits common mode operations to the higher potential, in the present example 5 volts, to provide a resultant wider common mode operating range. The common mode range is the ability of the comparator to resolve accurately between two potentials within the supply range. A trickle source is defined as a residual continuous current which is not a significant determinant of the total power and thus can be ignored. In this case, the current is so small that a simple charge pump operating from the three volt supply can provide the necessary potential. The charge pump can be fully integrated, thus, no significant tradeoff is encountered by having this circuit on chip. In the preferred embodiment, in addition to the 3 volt power supply, a five volt supply is used since it is needed for other components of the system the comparator operates in and no penalty is incurred due to charge pump efficiency or additional circuit complexity.

In addition, the trickle current causes the input stage of the circuit to operate in the subthreshold mode, thereby consuming less power and minimizing offsets due to voltage stresses and providing higher gain at the input. As is known by those skilled in the art, the subthreshold region provides the maximum available gain since the load values are inversely proportional to the current whereas above the threshold, the transconductance is a square root function of current.

Referring to FIG. 5, the trickle current generated by the bias circuit is utilized to provide bias inputs BIAS3, BIAS4 to devices 332, 333. The bias inputs BIAS3, BIAS4, mirrored from the bias circuit, cause devices 332, 333 to operate in the subthreshold region, pulling the devices above the normal supply voltage, in the present example 3 volts, and increasing the common mode range. In particular, in the present example, the common mode range is extended from 1.4–2.5 volts to approximately 1.4 volts to 4.5 volts. As the comparator has wide common mode range, the need for switching between ranges, utilized in prior art devices to achieve a wider common mode range, is eliminated and furthermore offset correction due to sampling, needed for the switching process, is not required. To improve the gain of the second stage of the comparator circuit, it is desirable to operate the mirror devices in saturation which implies the drop across the devices (drain to source) is greater than the threshold (1 volt). This cuts into the common mode range which ultimately restricts the useful range of operation.

Figure 7:
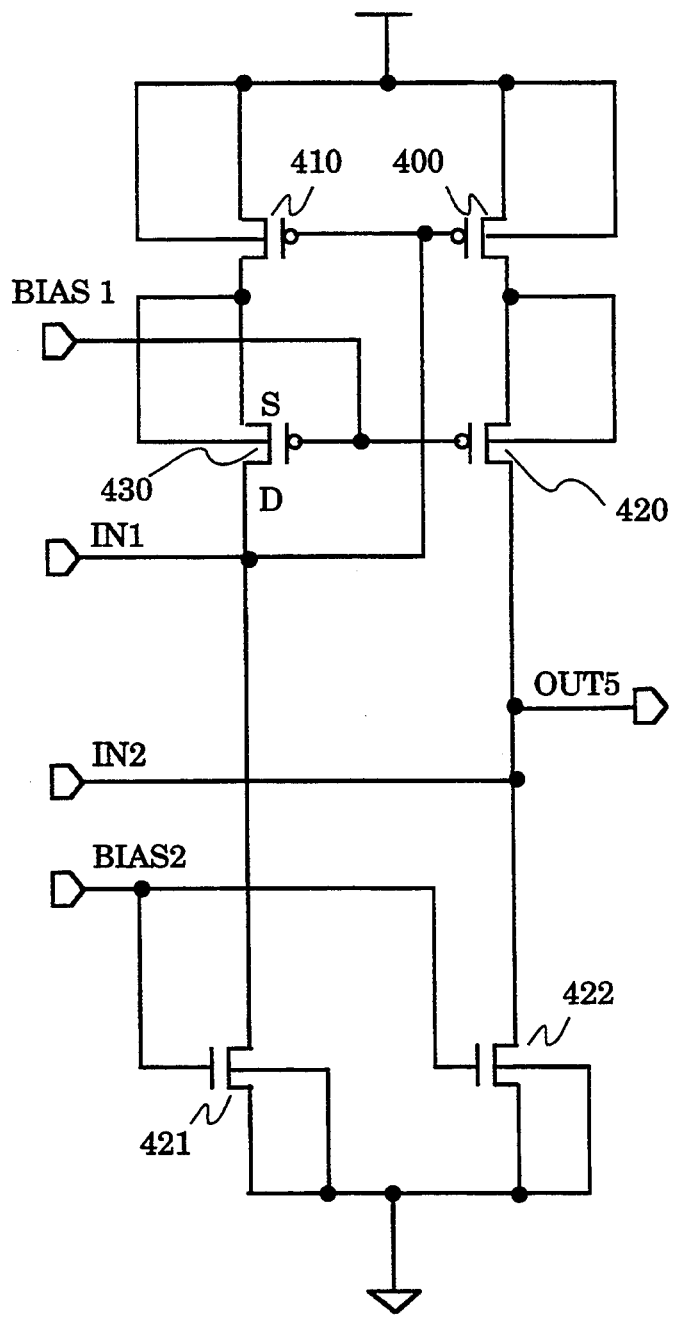
FIG. 7 is an exemplary circuit diagram of the cascode portion of the second stage of the comparator circuit of the present invention.

Referring to FIG. 7, in the comparator circuit of the present invention, the drain of device 430 is connected to the gate of device 400 instead of the typical connection of connecting the drain of device 410 to the gate of device 400. By connecting the drain of device 430 to the gate of device 400, device 400 is forced into the linear range, which reduces the voltage drop across device 400 and minimizes the effect on the common mode range.

In order to achieve high resolution and accurate measurements, offsets must be minimized in the first input stage. These offsets are subsequently amplified and cause erroneous measurements to occur. Offsets are generated due to a variety of factors such as voltage stresses, mismatched devices and process gradients. It is critical that offsets are minimized at the input stage, that is the first stage of the comparator, because subsequent stages simply amplify those offsets. One element provided to minimize offsets is an innovative transmission gate that couples the drain inputs when the comparator is not operating. Thus, when signals are not input to the comparator, the transmission gate causes the drains of the two input transistors to be coupled together.

The gate of the device that couples the drains together is controlled by a signal that indicates the start of a conversion process. In a successive approximation implementation of an A/D converter, the comparator makes a decision as to whether or not the next bit is above or below the output of the DAC; thus, the DAC voltage is corrected in the direction to minimize the error between the input voltage and the A/D equivalent digital word. The switch is turned off whenever a comparator decision is being made. When the switch is on the comparator drain potentials are equal and sources of offset are eliminated. This minimizes offsets and initializes the comparator to a stable state. As the drain voltage is coupled to a common supply voltage and common potential, the voltage stresses on the inputs are maintained to be the same thereby minimizing the offsets due to excessive drain voltage imbalances which result in long term voltage induced mobile charge buildups or offsets. In addition, the balanced drains enable the comparator circuit to quickly and consistently. An exemplary transmission gate is illustrated in FIG. 5. Transmission gate 330 maintains the drains of transistors 335 and 340 coupled together such that the differential output nodes 345, 350 are balanced and the settling time for the comparator is minimized. The transfer gate is enabled before the circuit is in normal AC operation and is disabled during normal operations by signal "Balance 1" 347.

Referring back to FIG. 3 and FIG. 5, the present embodiment employs a differential balanced active load to maintain a fully differential operation. This circuit employs a circuit design technique which uses a separate bias generating input located in the bias circuit which is mirrored to provide bias input, instead of connecting the load devices in the conventional manner wherein the gate and drain of device 335 (FIG. 5) are tied together. More particularly, an external bias signal BIAS5, generated by the bias circuit, is connected to the gates of devices 335, 340. The resulting topology is fully symmetric and drain induced offsets caused by an unbalanced load are eliminated.

The active balanced load utilized in the first stage of the comparator of the present invention is quite different from prior art circuits in which the operation is single ended, that is one output provides high gain and impedance and the other low impedance and gain. Although a single ended circuit is effective for high gain, the problem of offset is compounded. As the offset is amplified in subsequent stages of the comparator, it is important that the first stage inputs are symmetric to minimize the offset. Thus, the transfer gate, in conjunction with an active, balanced load, enables like-impedances and characteristics to be observable on both sides of the stage, minimizing offset.

As noted earlier, it is critical to minimize the offsets in the first stage of the comparator to minimize erroneous measurements. Therefore, to further minimize errors, the semiconductors are fabricated to minimize process gradients caused by non-uniform layers generated during the masking processes and of semiconductor fabrication. These gradients typically cause the transistors to have non-uniform thresholds which cause offsets to occur during operation of the circuit. To avoid process gradients, the semiconductor devices are fabricated in a common centroid or cross coupled layout. This common centroid layout cancels process gradients by distributing and matching devices. This is illustrated by FIGS. 6a and 6b.

Figure 6A:
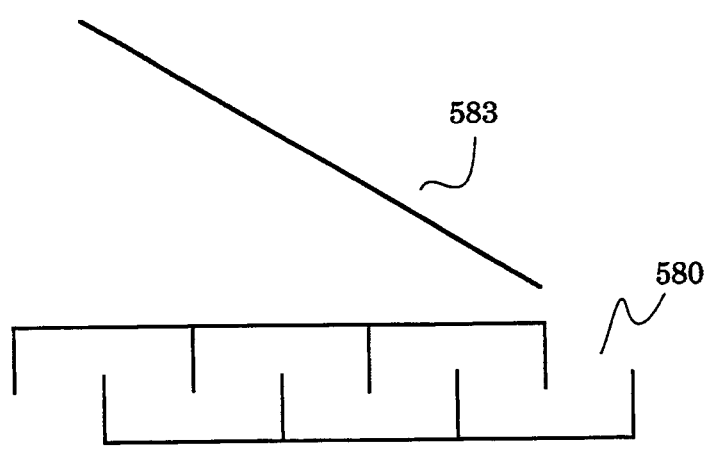
FIGS. 6a and 6b illustrate the common centroid layout of semiconductor devices in the comparator of the present invention to minimize offsets.
Figure 6B:
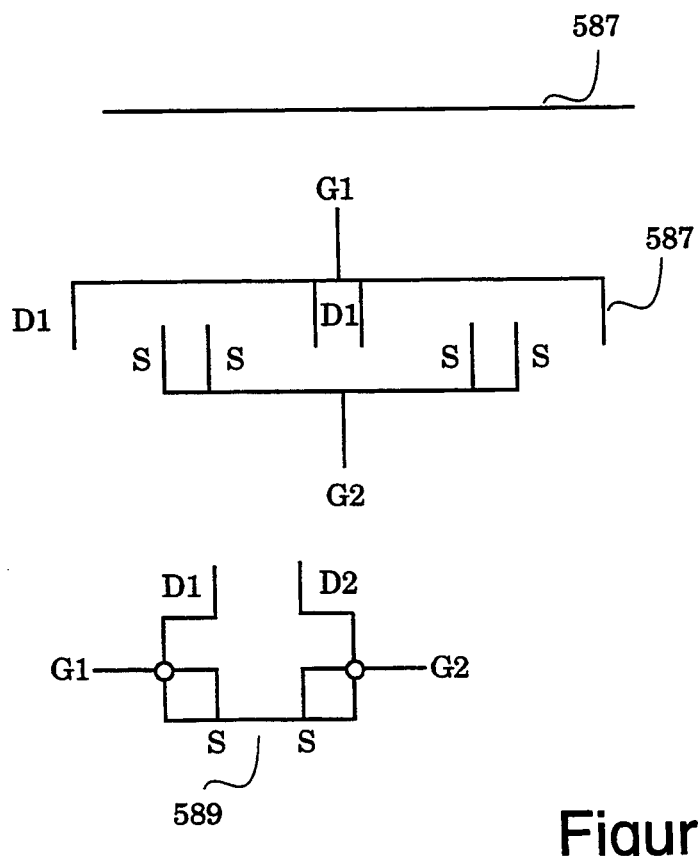

FIG. 6a illustrates standard layout 580 of source, gates and drains of FET devices. Gradient 583 is generated which causes offsets during circuit operation. An embodiment which minimizes gradients is illustrated in FIG. 6b. The drains and sources are distributed across the device at opposing locations such that gradient generated by one portion is canceled out by the opposing portion. The layout 587 maintains a consistent output 587 during operation, minimizing offsets. The equivalent circuit 589 shows common sources to fabricate the components. A common centroid interdigitated device appears to be one distributed device. The gates of the device are connected in a manner that causes either drain or sources of two devices to be shared. Another criterion for this technique to work is that the total number of gates is $2^N$ where N is an integer greater than or equal to two. With this technique, symmetry is only maintained about the center axis or the structure is reflexively folded about the axis. The distance of each drain and source of each device are located an equal distance relative to the center axis of the device. It is possible for drains or sources to be shared (normally sources are common). By sharing drains and sources, the total device source capacitance is reduced which in turn reduces the "tailpole" which causes instability and slows down circuit operation. This layout, furthermore minimizes the total combined device area reducing offset, leakage and area.

The techniques utilized to provide symmetry may be imposed on the subsequent stages. However, due to the nature of the subsequent stages, the contribution to offset the subsequent stages is minimal. In particular, the takeover gain of the subsequent stages minimizes the offset generated by the subsequent stages. The definition of takeover gain is the required gain to reduce the total cumulative contribution of subsequent stage. The total input offset is the sum of contributions made by individual stages divided by the gain of prior stages. From this it is clear that the contribution of offset is dominated by the input stage, thus most of the attention must be focused in this region. Total offset is given by the offset of the first stage summed with the subsequent offsets of the following stages divided by the gain of previous stages. From this discussion, it is apparent that offset of later stages are significantly less important than the initial stages. Advantage can be taken of this observation by simplifying the design and minimizing circuit complexity. This effect is utilized by the unique cascode circuit of the second stage to provide high resolution at low power.

The folded cascode circuit of the second stage provides very high gain which enables the comparator to operate at one millivolt resolution. The folded cascode circuit implementation is ideally suited to minimize offset since input gain is maximized while a fully symmetric differential topology is maintained. The folded cascode circuit steers differential current received from the input stage, IN1, IN2, which is being driven by a push/pull current source. Any differences on the input current will force amplified voltage to the third stage for subsequent output.

An illustration of the cascode circuit is shown in FIG. 7. The cascode circuit operates primarily in a current mode for speed as current can be steered faster than voltages can be changed. The advantage to the cascode circuit is the high gain achieved at the output. Thus, for small changes of current input, large voltage changes are seen at the output. However, as the circuit operates at low power, the limitation of voltage swing due to the bias input to the circuit is significant. In the present embodiment the transistors are in sub-threshold operation. Therefore the bias input is equal to the threshold voltage, and in a two-stacked transistor cascode circuit having a common threshold voltage Vt equal to one volt, the swing is limited to within two volts of the voltage rail. This problem is of significance in low voltage operation in which the maximum voltage rail is three volts. Therefore, to provide high gain with maximum voltage swing, a connection is made between the gate of the first transistor 400 and the drain of the second transistor 430 to generate a gain loop that puts the gates 410, 400, 430, 420 into saturation such that the voltage drop across the transistors is equal to Vsat, a value much smaller than the threshold value. Thus, the swing is no longer limited by a value equal to twice the threshold voltage. Rather, the swing is limited by a much smaller value equal twice the saturation voltage.

In the present illustration, instead of operating at a threshold voltage of one volt, the transistors operate at the saturation voltage of approximately 0.1 volts. Therefore, the voltage swing is limited by twice the saturation voltage or 0.2 volts. It can therefore be seen that the benefits from a cascoded device obtained without the limitation of swing voltages.

The present design differs from previous designs in that a complete stack of cascode N-channel devices are eliminated. In general N-channel devices provide much high drain impedance since the channel length modulation is less. However, utilizing the present design, a complete stack of N-channel devices is removed. This has the added effect of allowing lower power supply operation.

The second stage receives the differential current output of the first stage, amplifies the current and translates the current to a voltage value for input to the third stage of the comparator circuit. The third stage generates the single ended output voltage indicative of the comparison between the two input values at the first stage. The purpose of the third stage is to translate the differential voltage to an output voltage, for example a voltage corresponding to a digital value of one or zero, while maintaining the circuit complexity as simple as possible. For this purpose, only two devices are required. Instead of using a digital device, the output stage consists of a current mirror and a gain device. This analog implementation provides additional gain and also maintains the same current references as the rest of the circuit; thus errors caused by differing references and device parameters are avoided. If a digital circuit, such as an inverter is used, these errors would be realized as a digital circuit has an independent reference which affects the operation relative to the rest of the circuit.

The bias circuit provides the necessary bias values for operation of the comparator. The current bias is generated by a closed loop, push-pull configuration. However, the high gain of the bias circuit can force the bias circuit into a latch state. To eliminate the occurrence of a latch state, prior art designs typically modify the device dimensions (the fabricated area of the semiconductor) forming the transistors of the loop to be unequal such that latch states will not occur. In the bias circuit utilized in the comparator of the present invention, $\Delta V_{be}$ is utilized to avoid the latch state. The current is generated from a ground based reference using a diode reference. Diodes in a CMOS circuit are implemented with transistors. As such, the diodes have an associated beta or gain. In an N-well process a vertical PNP bipolar transistor exist. If the base is grounded, the bipolar transistor will operate as a diode. Thus, interdigitated devices can also be used in the bias circuit since they are the same size, again resulting in minimum area and minimum offset.

High gain closed loop current sources are notorious for metastability and latch like characteristics. Closed loop circuits such as these require startup circuits to initiate the current loop. In one embodiment of the circuit of the present invention, a digitally controlled startup circuit is used to provide a current path. In order to start the loop, device 570 provides direct connection of current input to drain of device 540 which turns on the loop. Once the loop is turned on, the device 570 can be turned off so that there is no longer an error current due to external current input that was used to start up the loop to generate the bias current.

Figure 8:
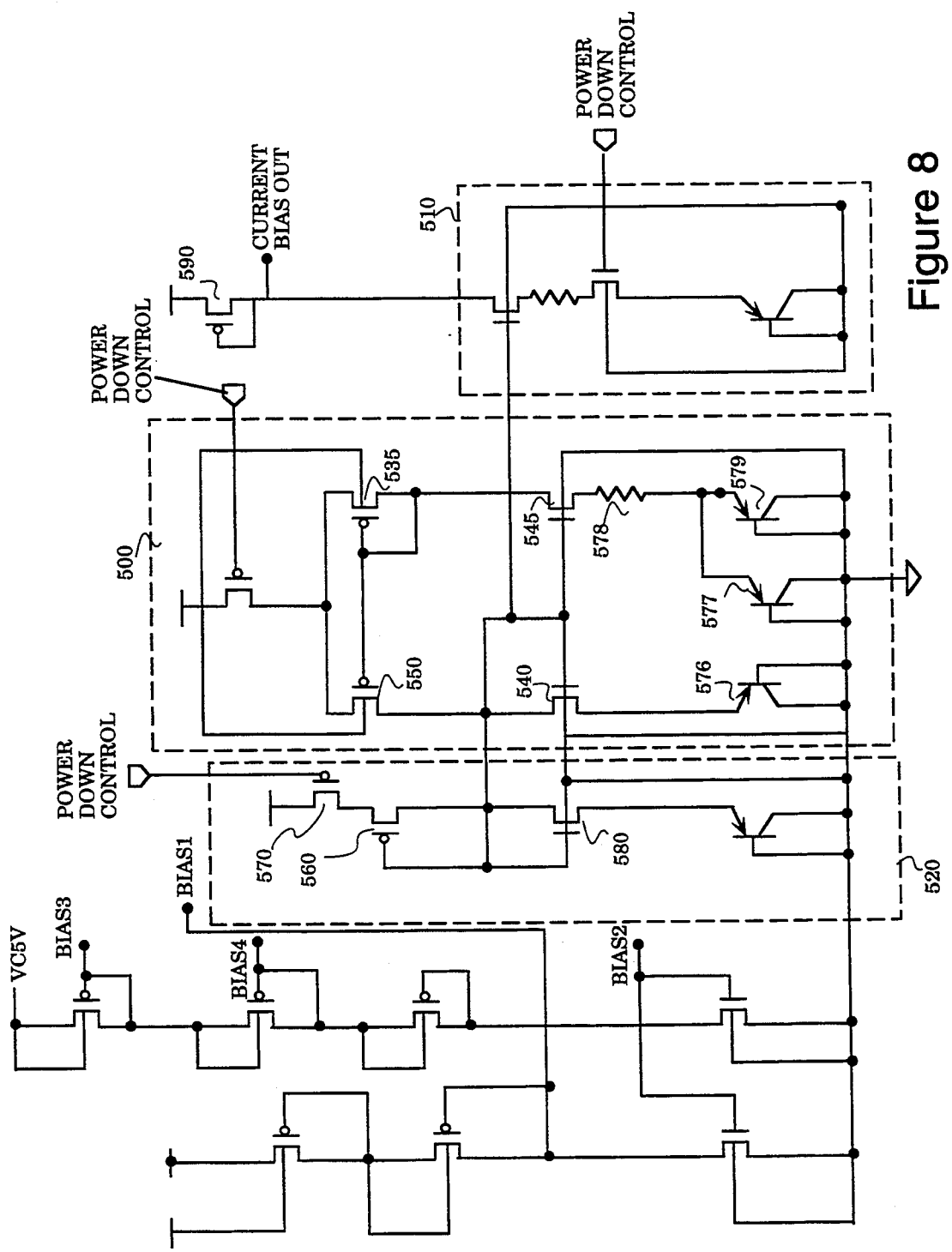
FIG. 8 is an exemplary circuit diagram of a portion of the bias circuit of the comparator of the present invention.

The startup current in the present embodiment is provided to the remainder of the circuit using a current bipolar string which precisely matches the current bias generator portion of the circuit. This is illustrated in FIG. 8. The current bias generator portion of the bias circuit 500 illustrates a closed loop configuration with gain associated with it to provide the current required to drive the comparator circuit. More particularly, transistors 530, 535, 540, 545 form the loop. The startup circuit 520 includes a trickle current that is pulled up on startup and is connected to the loop 530, 535, 540, 545 to start up the current flow in the loop. To prevent the loop from entering into a latch state, the resistor value, gain of the circuit and the startup loop gain are selected so that there is sufficient initial gain to insure that circuit operate at a stable bias point. Initially, loop gain is high and excess gain is dropped across resistor 570. Eventually gain will equalize to 1, due to losses in the resistor and diodes 576, 577, 579. To put the circuit into a stable operating condition to maintain a stable bias situation, enough loop gain to force a voltage drop across resistor is needed. Thus, in order to provide a startup current source that is reproducible and accurate, a diode reference resistor string 510 identical to the one used in the current source loop was used. The diodes and an interdigitated resistor match utilized in the string 510 and manufacturability is improved. The string 510 functions as a current mirror to pick off from the loop 500 the bias current needed to drive the remainder of the circuit.

The bias circuit furthermore provides for temperature compensation using bipolar diodes and a resistor in the bias circuit. As shown in FIG. 8, the sign of the temperature coefficient of the resistor is the opposite of that of the diodes. Therefore, the temperature coefficient of the diodes 576, 577, 579 and resistor 578 cancel each other and the circuitry is less sensitive to temperature variation.

Another element of the invention not previously discussed is that the diffusion body regions of device of the P-channel devices are tied to their sources. This eliminates a back gating effect and allows lower voltage operation. For example, referring to FIG. 3, most p-channel devices have connection of the source to the body or well of the device. Furthermore, voltage compensation is improved by connecting the resistor wells to the highest available potential thus reducing the voltage coefficient of the resistor. In addition, the design allows the 5 volt supply to be turned off without having a significant increase in current due to parasitic DC paths or forward biased junctions.

The invention has been described in conjunction with the preferred embodiment. It is evident that numerous alternatives, modifications, variations and uses will be apparent to those skilled in the art in light of the foregoing description.

What is claimed is:

1. An analog comparator circuit which operates within a wide common mode range with high resolution comprising:
   a bias subcircuit for generating bias signals comprising;
      a first power source providing a first voltage input,
      trickle source generating means coupled to receive the first voltage input, said means generating a trickle current;
   first input stage comprising;
      a pair of differential amplifiers coupled to receive first and second signal inputs for comparison, each differential amplifier comprising a source, drain and gate,
      said trickle current couple to the drains of the differential amplifiers, forcing the first input stage to operate in subthreshold range, thereby enabling the comparator circuit to operate within a wide common mode range,
      said first stage generating first and second differential signals indicative of the comparison of the first and second signal inputs;
   a second stage coupled to receive the first and second differential signals from the first stage and producing an amplified voltage signal representative of the first and second differential signals and the comparison between the first and second signal inputs; and
   a third stage coupled to receive the amplified voltage signal from the second stage and producing an output signal indicative of the difference between the first and second signal inputs.

2. The analog comparator circuit as set forth in claim 1, said second stage further comprising a coupling to put at least one device of a device stack in a linear operating range such that the voltage drop across the device is decreased while the gain is maintained to further improve the common mode range.

3. The analog comparator circuit as set forth in claim 1, wherein said second stage comprises devices which form a gain loop to amplify the differential signals received from the first stage, said gain loop biased by a bias signal to operate the devices of the gain loop in saturation wherein the voltage drop across the devices corresponds to a saturation voltage, Vsat, and the voltage swing output is only limited by the saturation voltage.

4. The analog comparator circuit as set forth in claim 1, further comprising a transmission gate to selectively couple the drains of the differential amplifiers to balance the drain voltages and therefore the output nodes to permit fast settling time of the comparator circuit and minimizing voltage stresses which cause offsets.

5. The analog comparator circuit as set forth in claim 1, wherein the devices are common centroid interdigitated devices which cancels out process gradients.

6. The analog comparator circuit as set forth in claim 1, wherein the bias circuit comprises a startup circuit which when turned on, generates an error current which initiates a bias generating loop, said startup circuit turned off after the loop is initiated.

7. The analog comparator circuit as set forth in claim 6, wherein said bias circuit further comprises a bipolar string which mirrors a string in the bias generator portion of the circuit, said bipolar string mirroring the output of the bias generator without affecting the operation of the bias generator.

8. The analog comparator circuit as set forth in claim 7, wherein the bias generator portion of the circuit comprises a resistor selected to provide for temperature compensation of the circuit.

9. In a comparator circuit comprising two differential amplifiers for generating, differential signals indicative of the difference between first and second input signals, said circuit driven by a first power source, a method for increasing the common mode range of the comparator, comprising the steps of:
   providing a trickle current generated from the first power source to drive the two differential amplifiers into saturation and increase the common mode range;

providing a second stage subcircuit coupled to receive the differential signals generated by the differential amplifiers; and coupling to put at least one device of a device stack in the second stage subcircuit in a linear operating range such that the voltage drop across the device is decreased while the gain is maintained to further improve the common mode range.

10. The method as set forth in claim 9, further comprising the step of biasing said second stage such that devices of the second stage operate in a linear region providing maximum voltage swing at the output of the second stage.

11. In a comparator circuit comprising two differential amplifiers for generating, differential signals indicative of the difference between first and second input signals, said circuit driven by a first power source, a method for increasing the common mode range of the comparator, comprising the steps of:

providing a trickle current generated from the first power source to drive the two differential amplifiers into saturation and increase the common mode range;

selectively coupling drains of the differential amplifiers to balance the drain voltages when a comparison operation is not performed, therefore permitting fast settling time of the output nodes and minimizing voltage stresses which cause offsets.

12. An analog to digital converter system for converting an input analog signal to an output digital signal comprising:

a multiplexing means for multiplexing samples of the analog input signal;

a comparator to compare the sampled analog input signal and an analog reference signal, said comparator operating within a wide common mode range with high resolution comprising:

a bias subcircuit for generating bias signals comprising:

a first power source providing a first voltage input, trickle source generating means coupled to receive the first voltage input, said means generating a trickle current;

first input stage comprising:

a pair of differential amplifiers coupled to receive first and second signal inputs for comparison, each differential amplifier comprising a source, drain and gate, said trickle current couple to the drains of the differential amplifiers, forcing the first input stage to operate in subthreshold range, thereby enabling the comparator circuit to operate within a wide common mode range, and said first stage generating first and second differential signals indicative of the comparison of the first and second signal inputs;

a second stage coupled to receive the first and second differential signals from the first stage and producing an amplified voltage signal representative of the first and second differential signals and the comparison between the first and second signal inputs; and a third stage coupled to receive the amplified voltage signal from the second stage and producing an output signal indicative of the difference between the first and second signal inputs;

a successive approximation register coupled to receive the output of the comparator and generate the output digital signal; and a digital to analog converter coupled to receive the output digital signal and generate a analog reference signal for input to the comparator as the analog reference signal for comparison to the next sample of the analog signal.

13. An analog comparator circuit comprising:

a first input stage comprising;

a pair of differential amplifiers coupled to receive signal inputs for comparison, each differential amplifier comprising a source, drain and gate, a transmission gate to selectively couple the drains of the differential amplifiers to balance the drain voltages and therefore the output nodes to permit fast settling time of the comparator circuit and minimizing voltage stresses which cause offsets, and a balanced active load to eliminate offsets;

a second stage coupled to receive first and second differential signals from the first stage, said second stage comprising a folded cascode subcircuit to produce an amplified voltage output reflective of the first and second differential signals, said folded cascode circuit comprising transistors connected in a gain loop to force the transistors to operate in a linear region, thereby maximizing the voltage swing of the output signal;

a third stage coupled to receive the amplified voltage signal for translating the amplified signal to an output signal; and a bias sub-circuit coupled to the first, second and third stages for providing bias signals to the first, second and third stages, said bias sub-circuit comprising a startup subcircuit and power down subcircuit;

wherein the analog comparator operates at low power, high resolution and wide common mode range.

* * * * *

UNITED STATES PATENT AND TRADEMARK OFFICE
CERTIFICATE OF CORRECTION

PATENT NO. : 5,374,859
DATED : December 20, 1994
INVENTOR(S) : Doyle et al.

It is certified that error appears in the above-identified patent and that said Letters Patent is hereby corrected as shown below:

In column 2 at line 65 delete "eliminates in" and insert --eliminate--

In column 3 at line 50 delete "lo"

In column 8 at line 4 insert --is-- following "device" and prior to "obtained"

In column 8 at line 18 delete "the," and insert --the--

In column 9 at line 36 delete "diffusion body regions of device" and insert --body diffusion regions--

Signed and Sealed this

Twelfth Day of November, 1996

*Attest:*

BRUCE LEHMAN

*Attesting Officer*   *Commissioner of Patents and Trademarks*